(12) United States Patent  
Sumioka

(10) Patent No.: US 8,389,980 B2  
(45) Date of Patent: Mar. 5, 2013

(54) LIGHT EMITTING APPARATUS

(75) Inventor: Yukari Sumioka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 297 days.

(21) Appl. No.: 12/866,825

(22) PCT Filed: Apr. 28, 2009

(86) PCT No.: PCT/JP2009/058721  
§ 371 (c)(1),  
(2), (4) Date: Aug. 9, 2010

(87) PCT Pub. No.: WO2009/136644  
PCT Pub. Date: Nov. 12, 2009

(65) Prior Publication Data  
US 2011/0006313 A1 Jan. 13, 2011

(30) Foreign Application Priority Data  
May 9, 2008 (JP) .................................. 2008-122892

(51) Int. Cl.  
H01L 29/08 (2006.01)

(52) U.S. Cl. ................................ 257/40; 257/90; 257/89

(58) Field of Classification Search .................... 257/89, 257/98, 40, E33.072  
See application file for complete search history.

(56) References Cited

U.S. PATENT DOCUMENTS

| 5,779,924 | A | 7/1998 | Krames et al. .................. 216/24 |
| 6,396,208 | B1 | 5/2002 | Oda et al. ....................... 313/504 |
| 6,831,407 | B2 | 12/2004 | Cok ................................. 313/504 |
| 6,967,437 | B1 | 11/2005 | Samuel et al. ................. 313/506 |
| 7,619,357 | B2 | 11/2009 | Onishi et al. .................. 313/506 |
| 2004/0070335 | A1 | 4/2004 | Cok ................................. 313/506 |
| 2008/0093978 | A1 | 4/2008 | Mori ............................... 313/498 |
| 2008/0164807 | A1 | 7/2008 | Hofmann et al. ............. 313/504 |
| 2008/0303419 | A1 | 12/2008 | Fukuda ......................... 313/504 |

FOREIGN PATENT DOCUMENTS

| EP | 1 411 561 A2 | 4/2004 |
| JP | 11-216163 | 8/1999 |
| JP | 2004-349111 | 12/2004 |
| WO | WO 00/70691 | 11/2000 |
| WO | WO 2006/021202 A1 | 3/2006 |

Primary Examiner — Matthew Reames  
(74) Attorney, Agent, or Firm — Fitzpatrick, Cella, Harper & Scinto

(57) ABSTRACT

Provided is a light emitting apparatus in which light extraction efficiency can be improved without adversely affecting a functional layer of a light emitting device. The light emitting apparatus includes multiple light emitting devices formed on a substrate, each of the multiple light emitting devices at least including: a reflective layer; a first electrode; the functional layer including an emission layer with an emission region; and a second electrode. In which an optical waveguide including a periodic structure is formed between the emission regions and the optical waveguide includes a surface which is opposite to the substrate and is more repellent to a light emitting material liquid for forming the emission layer than the emission region.

5 Claims, 7 Drawing Sheets

LIGHT EMITTING APPARATUS

TECHNICAL FIELD

The present invention relates to a light emitting apparatus including multiple light emitting devices formed on a substrate.

BACKGROUND ART

An organic electroluminescent (EL) light emitting apparatus includes organic EL devices, each of which has thin films and is of a self-emission type, and is applied as a new type flat panel display. Each of the organic EL devices is based on the following principle. That is, electrons are injected from a cathode into an organic layer and holes are injected from an anode into the organic layer, thereby generating excitons in an emission layer of the organic layer. Then, when the excitons return to the ground state, light is emitted from the emission layer. The emission layer is made of a fluorescent organic compound, a phosphorescent organic compound, or a light emitting material such as a quantum dot.

A challenge in developing the organic EL light emitting apparatus as described above is the improvement of light emitting efficiency. The organic EL device normally has a structure in which the anode, the organic layer including the emission layer, and the cathode are one-dimensionally laminated. In this case, a refractive index of the emission layer (approximately 1.5 to 2.0) is larger than a refractive index of air. Therefore, a majority of light emitted from an inner portion of the emission layer is totally reflected at a laminated film boundary whose refractive index changes from a high refractive index to a low refractive index. The totally reflected light becomes guided-wave light propagating in a direction parallel to a substrate, and then is confined to an inner portion of the organic EL device. A ratio of light which can be extracted for use to the outside (light extraction efficiency) is normally approximately 20%.

Therefore, in order to improve the light emitting efficiency of the organic EL light emitting apparatus, it is important to improve the light extraction efficiency.

Conventionally, it has been proposed to provide a periodic structure (such as sub-wavelength periodic structure or diffraction grating) in an upper or lower portion of a functional layer (on light extraction side or opposite side thereto) in order to prevent total reflection to suppress optical confinement in the inner portion of the organic EL device (see U.S. Pat. No. 5,779,924 and Japanese Patent Application Laid-Open No. 2004-349111).

Another method has been proposed in which, in order to reflect, in a light extraction direction, light which is confined as guided-wave light to the inner portion of the organic EL device and leaked from a side surface of the organic EL device, an inclined metal reflective surface is provided on the side surface of the organic EL device to improve light extraction efficiency (see Japanese Patent Application Laid-Open No. H11-214163).

When the periodic structure is provided in the upper portion of the functional layer as in the technologies described in U.S. Pat. No. 5,779,924 and Japanese Patent Application Laid-Open No. 2004-349111, there is a problem that the functional layer is damaged during a process of producing the periodic structure. When the periodic structure is provided in the lower portion of the functional layer, there is a problem that the thickness of the functional layer becomes nonuniform because of the unevenness of the periodic structure to locally change an interval between electrodes, and hence a short circuit occurs or a non-light emission point is generated.

The technology described in Japanese Patent Application Laid-Open No. H11-214163 has a problem that the distance between the electrodes is changed between a central portion and a peripheral portion of the organic EL device because of the inclination of the metal electrode, and hence a reduction in device endurance due to local light emission or an increase in number of non-light emitting devices due to a short circuit between electrodes occurs.

DISCLOSURE OF THE INVENTION

The present invention has been made in view of the circumstances described above. Therefore, an object of the present invention is to provide a light emitting apparatus in which light extraction efficiency can be improved without adversely affecting a functional layer of a light emitting device.

In order to solve the problems described above, the light emitting apparatus according to the present invention has the following features. That is, the light emitting apparatus according to the present invention includes multiple light emitting devices formed on a substrate. Each of the multiple light emitting devices at least includes: a reflective layer; a first electrode; a functional layer including an emission layer with an emission region; and a second electrode. An optical waveguide including a periodic structure is formed between the emission regions. The optical waveguide includes a surface which is opposite to the substrate and is more repellent to a light emitting material liquid for forming the emission layer than the emission region.

According to the light emitting apparatus in the present invention, the light extraction efficiency can be improved without adversely affecting the functional layers of the light emitting devices.

Further features of the present invention will become apparent from the following description of exemplary embodiments with reference to the attached drawings.

BEST MODE FOR CARRYING OUT THE INVENTION

Hereinafter, a light emitting apparatus according to an embodiment of the present invention is described.

The light emitting apparatus according to the present invention includes multiple light emitting devices formed on a substrate. Each of the light emitting devices at least includes a reflective layer, a first electrode, a functional layer having an emission layer with an emission region, and a second electrode. An optical waveguide having a periodic structure is formed between the emission regions. The optical waveguide includes a surface which is opposite to the substrate and which is more repellent to a light emitting material liquid for forming the emission layers than the emission regions.

An optical distance of the optical waveguide in a direction perpendicular to a surface of the substrate is desirably smaller than twice an optical distance of each of the emission regions in the direction perpendicular to the surface of the substrate. The optical waveguide desirably has an insulating property. The second electrode can be further formed on the optical waveguide and can include one of a light transmissive electrode which is a transparent electrode and a metal translucent electrode. The periodic structures can include metal.

A light shielding layer is desirably provided on a light extraction side. Light extracted to an outside through the periodic structures desirably has one of a maximum intensity and a maximum luminance in a direction having an angle larger than 90° relative to a guided-wave direction of the optical waveguide. The optical distance of the optical waveguide in the direction perpendicular to the surface of the substrate is desirably 3/8 times or more to 11/8 times or less a light emission peak wavelength $\lambda$ of the emission layer.

Figure 1:
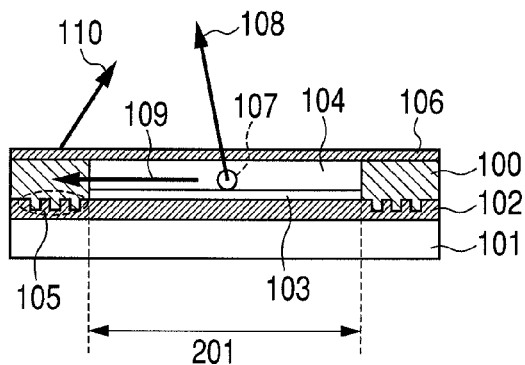
FIG. 1 is a schematic cross sectional view illustrating a fundamental concept of a light emitting device to which the present invention can be applied.

FIG. 1 is a schematic cross sectional view illustrating a fundamental concept of the light emitting device to which the present invention can be applied.

As illustrated in FIG. 1, in the case of the light emitting device to which the present invention is applied, firstly, a reflective layer 102 is formed on a substrate 101. The reflective layer 102 can be made of metal. Periodic structures 105 are formed in portions of a surface of the reflective layer 102 which is opposite to the substrate 101. A first electrode (anode) 103 is formed on the reflective layer 102. An optical waveguide 100 is formed so as to surround the first electrode 103. As a result, periodic structures 105 reflecting the periodic structure 105 on the reflective layer 102 are formed also on the substrate 101 side of the optical waveguide 100. Therefore, the optical waveguide 100 has the periodic structure 105.

The optical waveguide 100 can be made of a transparent insulating material. A surface of the optical waveguide 100 which is opposite to the substrate 101 is made more repellent to a light emitting material liquid for forming the emission layer than an emission region 201. The optical waveguide 100 can be formed by patterning a photosensitive resin with liquid repellency by a photolithography process. Alternatively, a transparent inorganic insulating material, a transparent resin, or a laminated structure thereof may be patterned and then subjected to fluorination treatment to have liquid repellency. Alternatively, a transparent inorganic insulating material, a transparent resin, or a laminated structure thereof may be patterned and then a liquid repellent material may be formed. Examples of the resin material which can be used include an acrylic resin, a fluorine resin, and a polyimide resin. Examples of the transparent inorganic material which can be used include silicon oxide (SiO), silicon nitride (SiN), and silicon oxynitride (SiON). Other materials satisfying the characteristic described above can be used in place of the materials described above.

A functional layer 104 including an emission layer is formed on the first electrode 103 in the region surrounded by the optical waveguide 100. The emission layer is formed by applying a light emitting material liquid in which a light emitting material is dissolved. Examples of the application method which can be used include a dispenser method, an ink-jet method, a nozzle print method, and a printing method which are normally employed.

A second electrode 106 is formed on the functional layer 104. The second electrode 106 is desirably a semi-transmissive film.

Figure 2:
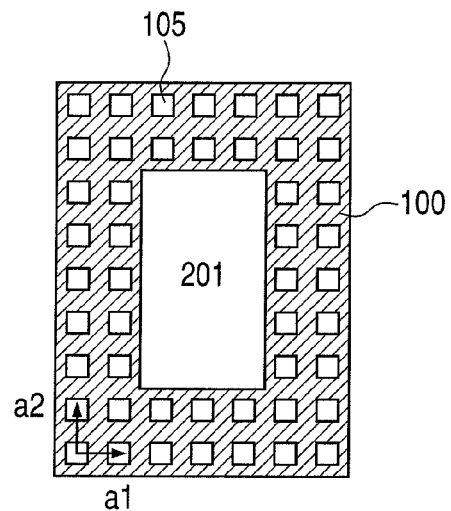
FIG. 2 is a schematic plan view illustrating the light emitting device to which the present invention can be applied.

FIG. 2 is a schematic plan view illustrating the light emitting device to which the present invention can be applied. As illustrated in FIG. 2, the optical waveguide 100 having the periodic structure 105 is formed so as to surround the emission region 201. At least, the first electrode 103, the functional layer 104, and the second electrode 106 are formed in the emission region 201. According to the present invention, the optical waveguide 100 is provided with liquid repellency. Therefore, the light emitting material liquid which is a material of the emission layer is repelled on an upper surface of the optical waveguide 100, and hence the material can be formed in only the emission region 201 without overflowing. Thus, according to the present invention, pixel separation can be easily achieved.

Figure 3:
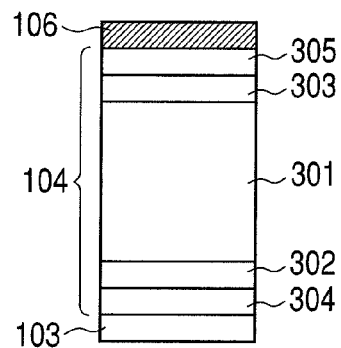
FIG. 3 is a schematic cross sectional view illustrating a functional layer which can be applied to the present invention.

FIG. 3 is a schematic cross sectional view illustrating the functional layer which can be applied to the present invention. As illustrated in FIG. 3, the functional layer 104 normally has a structure in which a hole transport layer 302, an emission layer 301, and an electron transport layer 303 are laminated. The emission layer 301 contains a fluorescent organic compound or a phosphorescent organic compound which corresponds to each light emitting color. The emission layer 301 may contain multiple materials such as a guest material and a host material. Examples of the light emitting material include a polymer material, a medium-molecular material, and a low-molecular material. As long as the light emitting material is of an application type, the light emitting material is not particularly limited. Examples of the polymer material include polyfluorene, polyfluorene copolymer, and polyphenylene vinylene. An example of the medium-molecular material includes oligofluorene. Examples of the low-molecular material include fluorene-based, pyrene-based, fluoranthene-based, or anthracene-based condensation polycyclic compound, and metal complex containing iridium. A thickness of the functional layer 104 is desirably in a range of 80 nm to 500 nm. A thickness of the emission layer 301 is desirably in a range of 20 nm to 200 nm.

If necessary, a hole injection layer 304 may be formed between the first electrode 103 and the hole transport layer 302, or an electron injection layer 305 may be formed between the second electrode 106 and the electron transport layer 303.

When a voltage is applied to the organic EL device having the structure as described above, holes are injected from the anode into the functional layer 104 and electrons are injected from the cathode into the functional layer 104. The injected holes and electrons form excitons in the emission layer 301.

When the excitons recombine, light (spontaneous emission light) is emitted from the emission layer 301.

In the structural example of the light emitting device illustrated in FIG. 1, the second electrode 106 side relative to a light emission point 107 is a light extraction side, and the optical waveguide 100 serves as a planar optical waveguide to a horizontal direction of the substrate 101. The reflective layer 102 and the second electrode 106 which sandwich the transparent insulating material correspond to a first reflective surface and a second reflective surface, respectively, thereby forming the optical waveguide 100. Light emitted from the light emission point 107 in the emission region 201 becomes propagating light 108 traveling to the light extraction side and guided-wave light 109 traveling through the optical waveguide 100 in the horizontal direction of the substrate 101. The guided-wave light 109 is converted into diffraction light 110 by the periodic structure 105 and extracted to the outside of the light emitting device. Therefore, according to the present invention, light extraction efficiency can be improved without adversely affecting the functional layer of the light emitting device.

In the present invention, in order to further improve the light extraction efficiency, it is desirable to reduce a guided-wave mode of the guided-wave light 109, and it is desirable to prevent the guided-wave mode from increasing when the guided-wave light 109 propagates from the emission region 201 to the optical waveguide 100. Therefore, an optical distance $\Sigma(nWi \cdot dWi)$ of the optical waveguide 100 in a direction perpendicular to the substrate surface is desirably set to a value smaller than twice an optical distance $\Sigma(nEi \cdot dEi)$ of the emission region 201 in the direction perpendicular to the substrate surface. Assume that a thickness of each of the layers of the optical waveguide 100 is expressed by dWi, a refractive index of each of the layers of the optical waveguide 100 is expressed by nWi, a thickness of each of the layers of the emission region 201 is expressed by dEi, and a refractive index of each of the layers of the emission region 201 is expressed by nEi.

The optical distance in the direction perpendicular to the substrate surface is a distance in the direction perpendicular to the substrate 101 between the first reflective surface and the second reflective surface in the region through which the guided-wave light 109 travels. In this embodiment, the optical distance corresponds to a distance between the reflective layer 102 and the second electrode 106 in FIG. 1.

In the present invention, in order to further improve the light extraction efficiency, it is desirable to prevent the guided-wave mode from reducing when the guided-wave light 109 propagates from the emission region 201 to the optical waveguide 100. When the guided-wave mode reduces, the guided-wave light 109 of the reduced guided-wave mode is reflected and thus does not enter the optical waveguide 100. Therefore, in order to improve the light extraction efficiency in the present invention, the optical distance of the optical waveguide 100 in the direction perpendicular to the substrate surface is desirably set to a value equal to the optical distance of the emission region 201 in the direction perpendicular to the substrate surface. In order to improve the light extraction efficiency of the emission region 201 by an interference effect, the optical distance of the emission region 201 in the direction perpendicular to the substrate surface in the present invention is approximately 3/8 times or more to 11/8 times or less a light emission peak wavelength λ. To be specific, the optical distance of the emission region 201 in the direction perpendicular to the substrate surface is desirably 140 nm to 1,073 nm because the visible light wavelength range is 380 nm to 780 nm. Thus, the optical distance of the optical waveguide 100 in the direction perpendicular to the substrate surface is also approximately 3/8 times or more to 11/8 times or less the light emission peak wavelength λ, that is, 140 nm to 1,073 nm.

In order to improve the efficiency of conversion from the guided-wave light 109 to the diffraction light to further exert a diffraction effect, it is desirable to increase a change in dielectric constant of the optical waveguide 100 by the periodic structure 105. In order to increase the change in dielectric constant, the periodic structure 105 is desirably made of a material significantly different in dielectric constant from the material for forming the optical waveguide 100. For example, the periodic structure 105 is desirably made of metal.

In the present invention, when a light shielding plate serving as a light shielding layer is provided based on a condition for generating a negative diffraction effect, a contrast can be further increased.

Figure 4A:
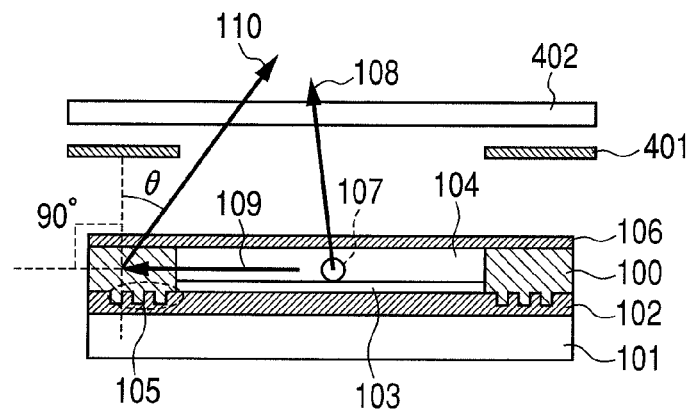
FIGS. 4A, 4B, and 4C are schematic cross sectional explanatory views illustrating a light emitting device capable of further increasing a contrast using a negative diffraction effect.
Figure 4B:
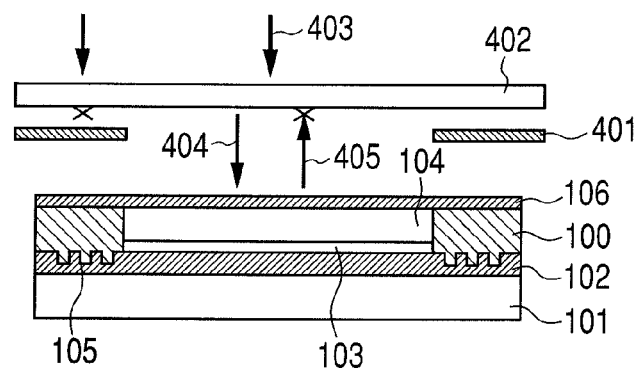
Figure 4C:
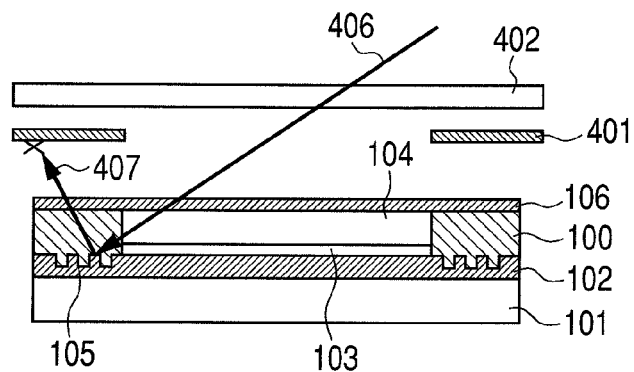

FIGS. 4A, 4B, and 4C are schematic cross sectional explanatory views illustrating examples of a light emitting device capable of further increasing a contrast using the negative diffraction effect. As illustrated in FIG. 4A, a period of the periodic structure 105 is provided such that a diffraction angle of the diffraction light 110 becomes larger than 90° relative to a traveling direction of the guided-wave light 109. When the normal to the substrate is taken as reference, the diffraction angle is a negative angle. Hereinafter, diffraction in a direction having an angle larger than 90° relative to the traveling direction of the guided-wave light 109 is referred to as "negative diffraction". Therefore, the period of the periodic structure 105 is provided such that negative diffraction light is generated from the guided-wave light 109 to be extracted to the outside. The light extracted to the outside through the periodic structure 105 desirably has a maximum intensity or a maximum luminance in the direction having the angle larger than 90° relative to the guided-wave direction.

A black matrix 401 is provided as the light shielding plate above the periodic structure 105 of the light emitting device to form the light shielding layer. A circularly polarizing plate 402 is provided above the black matrix 401. When a display apparatus includes multiple light emitting devices, the periodic structure 105 is formed around each of the light emitting devices and between adjacent light emitting devices. The black matrix 401 is also formed between adjacent light emitting devices.

The propagating light 108 from the light emission point 107 travels from an aperture portion of the black matrix 401 to the outside of the display apparatus. The diffraction light 110 having a wavelength to be extracted to the outside is adjusted to a negative diffraction angle relative to the guided-wave light 109 traveling through the optical waveguide 100 so as to travel from the aperture portion of the black matrix 401 to the outside.

FIG. 4B is a schematic view in a case where external light is incident on the display apparatus according to the present invention at an angle close to the vertical. Of incident light (close to the vertical) 403, an incident light 404 on an EL emission region is prevented by the circularly polarizing plate 402 from generating reflection light 405. An incident light on the periodic structure 105 from the top is prevented by the black matrix 401 from being reflected.

FIG. 4C is a schematic view in a case where external light is incident on the display apparatus according to the present invention in an oblique direction. Oblique incident light 406 passes through the circularly polarizing plate 402 to become circularly polarized light, and then is reflected on the periodic structure 105 to become oblique reflection light 407. The oblique reflection light 407 having the circularly polarized state is converted into elliptically polarized light by the periodic structure 105, but the elliptically polarized light is absorbed by the black matrix 401 and thus prevented from being reflected.

According to the present invention, the periodic structure 105 is provided to improve the light extraction efficiency and the reflection light generated from the external incident light can be reduced. Hence, the contrast can be further increased.

Next, the periodic structure 105 is described in more detail.

In this embodiment, as illustrated in FIG. 1, a part of the light emitted from the emission layer becomes the guided-wave light 109, propagates through the optical waveguide 100, and is extracted as the diffraction light 110 to the light extraction side (outside of light emitting device) through the periodic structure 105.

As illustrated in FIG. 2, in this embodiment, the periodic structure 105 is formed so as to surround the emission region 201. Two primitive lattice vectors defining the period of the periodic structure 105 are expressed by $a_1$ and $a_2$. Primitive reciprocal lattice vectors satisfying a relationship of Expression 1 described below with respect to the primitive lattice vectors $a_1$ and $a_2$ are expressed by $b_1$ and $b_2$.

$$a_i \cdot b_j = 2\pi \delta_{ij}, (i,j=1,2) \quad \text{(Expression 1)}$$

A peak wavelength of light emitted from the emission layer of the functional layer 104 is expressed by $\lambda$. A wave number is expressed by "$k=2\pi/\lambda$". A refractive index of the optical waveguide 100 is expressed by "n". A refractive index of a medium (air in general) located on the light extraction side is expressed by $n_{ext}$. Assume that a condition of $n > n_{ext}$ is satisfied.

A propagation coefficient in the direction parallel to the substrate 101 with respect to the guided-wave light 109 propagating through the optical waveguide 100 is expressed by $\beta$. An effective refractive index $n_{eff}$ and an effective absorption coefficient $K_{eff}$ with respect to the guided-wave light 109 are defined by Expression 2 described below. Assume that the effective refractive index $n_{eff}$ satisfies a condition of $n_{ext} < n_{eff} < n$.

$$\beta = (n_{eff} + i k_{eff}) k \quad \text{(Expression 2)}$$

In this case, a diffraction condition is obtained by Expression 3 described below based on a phase matching condition in the horizontal direction under the condition of $n_{ext} < n_{eff} < n$ on the assumption that two integers $m_1$ and $m_2$ denote diffraction orders and $\theta$ denotes the diffraction angle relative to the direction of the normal to the substrate.

$$n_{eff} - n_{ext} \sin\theta = \frac{\lambda}{2\pi} |m_1 b_1 + m_2 b_2| \quad \text{(Expression 3)}$$

In a case of a tetragonal lattice, when the period is expressed by "a", the primitive lattice vectors are obtained by Expression 4 described below and the primitive reciprocal lattice vectors are obtained by Expression 5 described below.

$$a_1 = \begin{pmatrix} a \\ 0 \end{pmatrix}, a_2 = \begin{pmatrix} 0 \\ a \end{pmatrix} \quad \text{(Expression 4)}$$

$$b_1 = \frac{2\pi}{a}\begin{pmatrix} 1 \\ 0 \end{pmatrix}, b_2 = \frac{2\pi}{a}\begin{pmatrix} 0 \\ 1 \end{pmatrix} \quad \text{(Expression 5)}$$

In this case, the diffraction condition of Expression 3 is expressed by Expression 6 described below.

$$n_{eff} n_{ext} \sin\theta = \frac{\sqrt{m_1^2 + m_2^2}}{a}\lambda \quad \text{(Expression 6)}$$

Attention is focused on any one of one-dimensional directions and it is assumed that $m_2=0$ (or $m_1=0$) and $|m_1|=m>0$ (or $|m_2|=m>0$). In this case, the diffraction condition of Expression 6 is simplified to become Expression 7 described below. When the relationship of $n_{ext} < n_{eff} < n$ is satisfied, a condition for causing each m-th-order diffraction is expressed by Expression 8 described below. A condition for causing a negative diffraction is expressed by Expression 9 described below.

$$n_{eff} - n_{ext}\sin\theta = m\frac{\lambda}{a} \quad \text{(Expression 7)}$$

$$\frac{m}{n + n_{ext}}\lambda < a \quad \text{(Expression 8)}$$

$$\frac{m}{n + n_{ext}}\lambda < a < \frac{m}{n_{ext}}\lambda \quad \text{(Expression 9)}$$

A condition in a case where only m-th-order negative diffraction light is to be generated is substantially expressed by Expression 10 described below, based on Expression 9 described above.

$$\frac{m}{n + n_{ext}}\lambda < a < \frac{m+1}{n + n_{ext}}\lambda \quad \text{(Expression 10)}$$

According to the light emitting device in the present invention, a material whose refractive index "n" is equal to approximately 1.3 to 2.5 is normally used for the optical waveguide 100. The refractive index $n_{ext}$ on the light extraction side is equal to approximately 1.0 to 1.5. Therefore, when low-order negative diffraction light including first-order to third-order diffraction light is mainly used, the period "a" of the periodic structure 105 is desirably substantially 0.26 times to 1.74 times the light emission peak wavelength $\lambda$. The visible light wavelength range is 380 nm to 780 nm, and hence the period "a" of the periodic structure 105 is desirably 100 nm to 1,360 nm.

The present invention is not limited to the specific examples described above.

The structure is described in which the anode is located on the substrate side and the cathode is located on the light extraction side. Even in a case of a structure in which the cathode is located on the substrate side, the anode is located on the light extraction side, and the hole transport layer, the emission layer, and the electron transport layer are laminated in the reverse order, the present invention can be embodied. Therefore, the light emitting apparatus according to the present invention is not limited to the structure in which the anode is located on the substrate side and the cathode is located on the light extraction side.

The light emitting material is not limited to the organic material. When an application type material can be used, the present invention can be embodied. For example, an inorganic compound or a quantum dot (QD) may be used.

The periodic structure 105 is not limited to the two-dimensional photonic crystal structure as described above, and may be a combination of one-dimensional diffraction gratings or a three-dimensional photonic crystal structure. Multiple types of periodic structures 105 having different primitive lattice vectors may be combined. The periodic structure 105 is not necessarily completely periodic, and may be a quasi-crystalline structure, a fractal structure, a structure in which the periodic structure 105 varies continuously, an irregular scattering structure, or a combination of the periodic structure 105 and any of the structures.

Figure 8A:
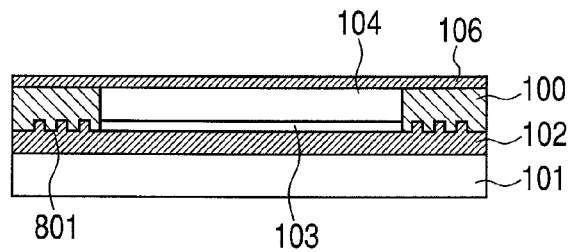
FIGS. 8A, 8B, and 8C are schematic cross sectional explanatory views illustrating periodic structures which can be applied to the present invention.
Figure 8B:
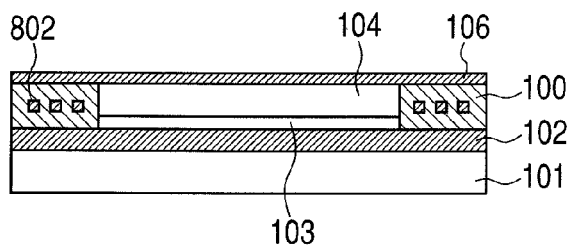
Figure 8C:
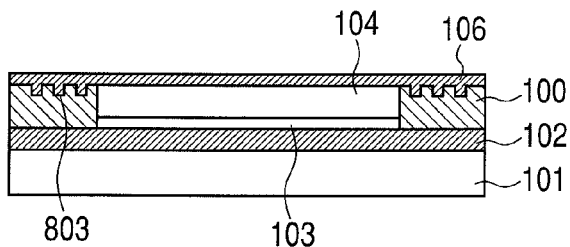

FIGS. 8A to 8C are schematic cross sectional explanatory views illustrating periodic structures which can be applied to the present invention.

The concave photonic crystal structure has been described. However, as illustrated in FIG. 8A, a convex photonic crystal structure 801 may be provided. As illustrated in FIG. 8B, a periodic structure 802 may be provided in the optical wavelength 100. As illustrated in FIG. 8C, a periodic structure 803 may be provided on a side of the optical wavelength 100 which is opposite to the substrate 101. That is, as long as the periodic structure is provided in at least a part of the optical wavelength 100, the present invention can be embodied.

The structure has been described in which the metal translucent electrode is provided as the electrode located on the light extraction side. However, even in a case of a structure in which a transparent electrode (light transmissive electrode) is provided as the electrode located on the light extraction side, the present invention can be embodied. In this case, an interface between the transparent electrode (light transmissive electrode) and air is set as a reflective surface. The metal translucent electrode and a dielectric layer may be combined. A multilayer interference film including any one of a metal layer, a transparent electrode (light transmissive electrode) layer, and a dielectric layer, or a combination of all the layers can be also provided as a reflective surface located on the light extraction side.

Figure 9A:
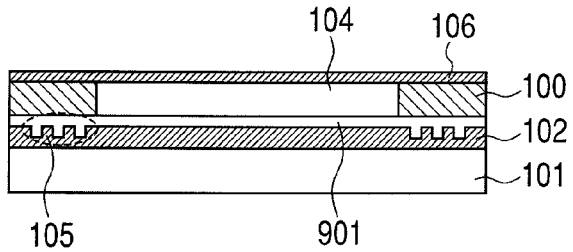
FIGS. 9A and 9B are schematic cross sectional explanatory views illustrating structures of first electrodes which can be applied to the present invention.
Figure 9B:
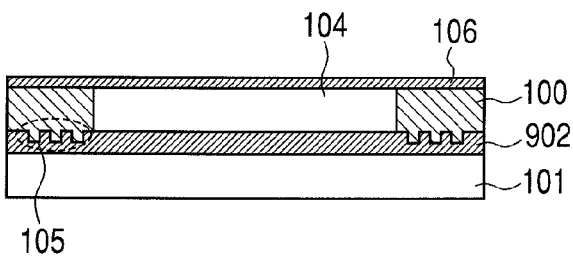

FIGS. 9A and 9B are schematic cross sectional explanatory views illustrating structures of the first electrode which can be applied to the present invention.

The structure has been described in which the first electrode 103 is formed in only the emission region 201. However, as illustrated in FIG. 9A, even in a case of a structure in which a first electrode 901 is formed under the optical waveguide 100, the present invention can be embodied. As illustrated in FIG. 9B, even in a case of a structure in which the reflective layer also serves as a first electrode 902, the present invention can be embodied.

Even in a case of a bottom-emission structure in which the substrate 101 side is the light extraction side, the present invention can be embodied.

Figure 10A:
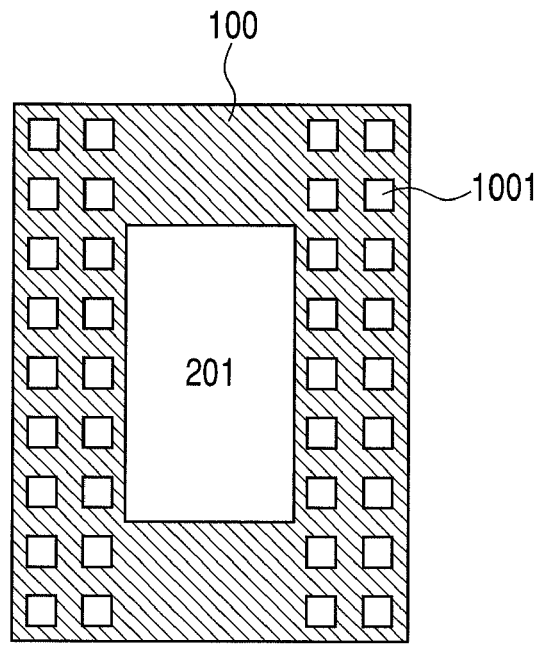
FIGS. 10A and 10B are schematic plan explanatory views illustrating positions of periodic structures which can be applied to the present invention.
Figure 10B:
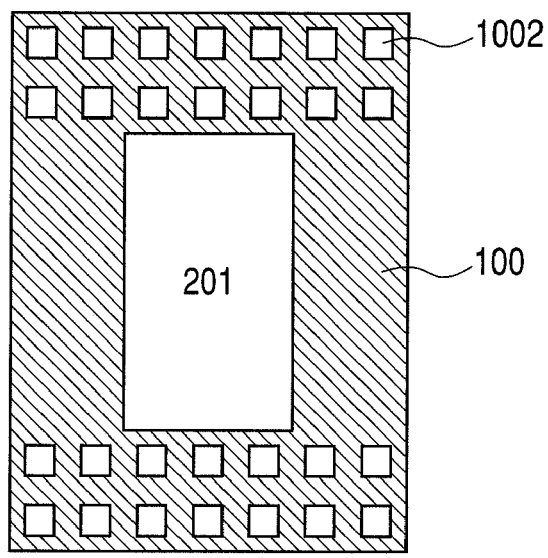
Figure 11A:
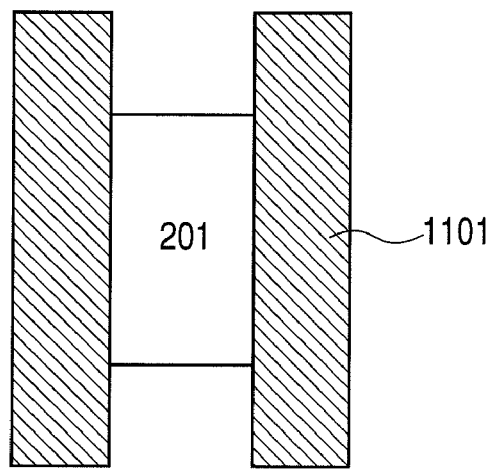
FIGS. 11A and 11B are schematic plan explanatory views illustrating positions of optical waveguides which can be applied to the present invention.
Figure 11B:
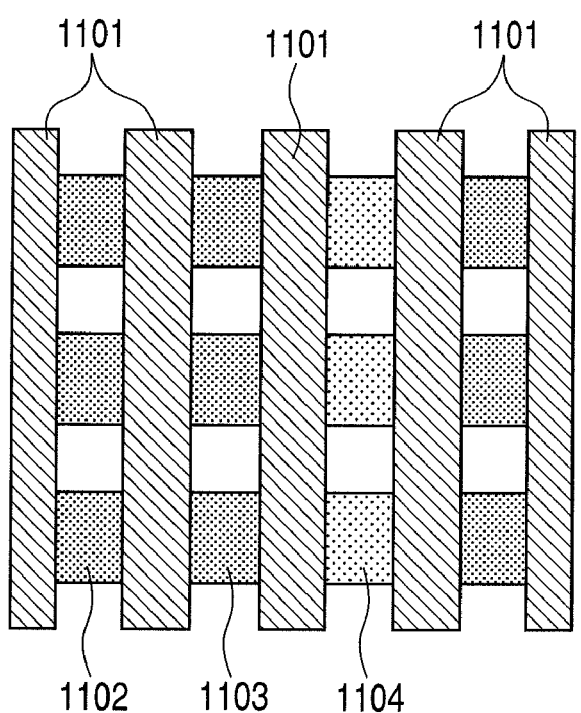

FIGS. 10A and 10B are schematic plan explanatory views illustrating positions of periodic structures which can be applied to the present invention. FIGS. 11A and 11B are schematic plan explanatory views illustrating positions of optical waveguides which can be applied to the present invention.

The structure has been described in which the periodic structure 105 is formed so as to surround the circumference of the emission region 201. However, even when a periodic structure 1001 (or 1002) is provided in at least a part of the circumference of the emission region 201 as illustrated in FIG. 10A (or 10B), an effect of the present invention can be obtained. The structure has been described in which the optical waveguide 100 with the liquid repellency is formed so as to surround the circumference of the emission region 201. However, when multiple pixels are provided, the structure as illustrated in FIGS. 11A and 11B may be employed. That is, as illustrated in FIGS. 11A and 11B, even in a case of a structure in which optical waveguides 1101 with liquid repellency are formed only between emission regions 1102, 1103 and 1104 of different colors, the present invention can be embodied.

Figure 5A:
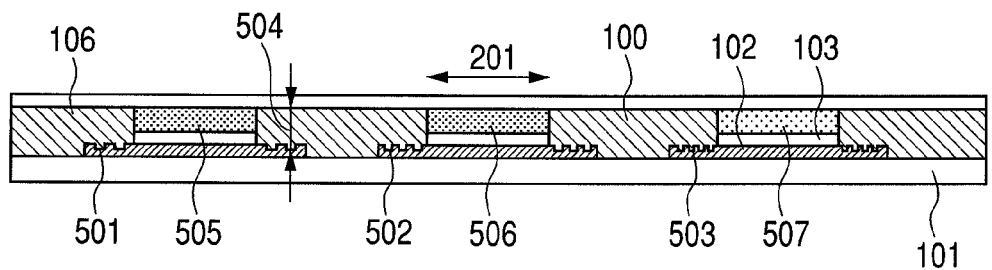
FIGS. 5A and 5B are schematic views illustrating a full-color organic EL light emitting apparatus according to Example 1.
Figure 5B:
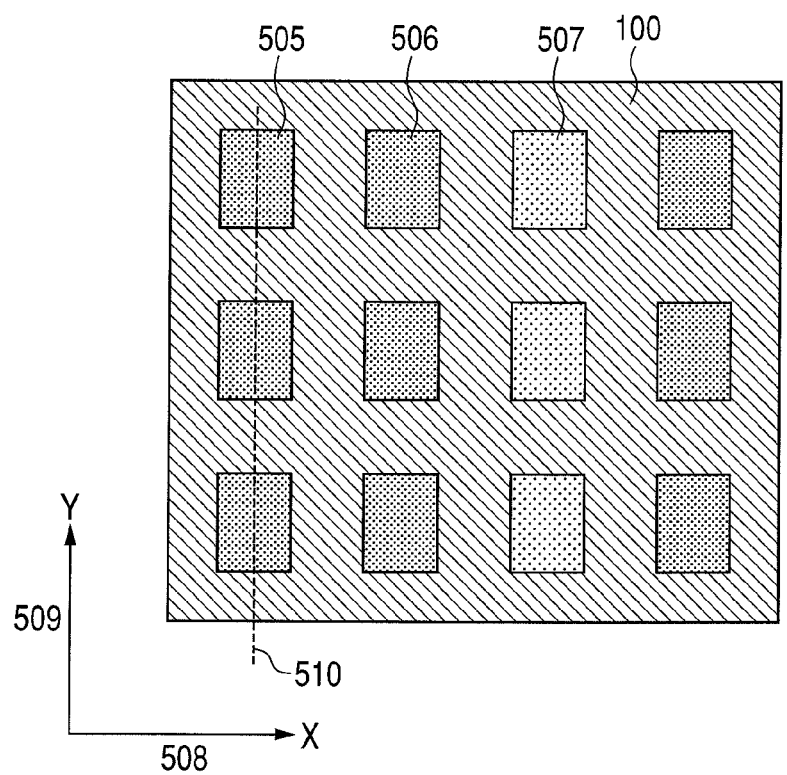

Hereinafter, specific examples of the present invention are described. FIGS. 5A and 5B are schematic views illustrating a full-color organic EL light emitting apparatus according to Example 1.

EXAMPLE 1

In Example 1, the full-color organic EL light emitting apparatus having the structure illustrated in FIGS. 5A and 5B was manufactured using the following method. That is, the light emitting apparatus according to Example 1 was an organic EL light emitting apparatus including multiple pixels. Each of the pixels included sub pixels of multiple colors (red (R) light emission 505, green (G) light emission 506, and blue (B) light emission 507). At least one of the sub pixels included the organic EL light emitting device.

In Example 1, firstly, a low-temperature polysilicon TFT driver circuit (not shown) was formed on a glass substrate serving as a support member and then a planarization film (not shown) made of acrylic resin was formed thereon to produce the substrate 101.

Next, an Ag alloy film whose thickness is approximately 150 nm was formed as the reflective layer 102 on the substrate 101 by sputtering. The reflective layer 102 made of Ag alloy is a high-reflection layer whose spectral reflectance is equal to or larger than 80% in the visible light wavelength range ($\lambda$=380 nm to 780 nm). In addition to the Ag alloy, for example, Al alloy may be used. A positive type resist was first formed on the reflective layer 102 by spin coating and then pre-baked. After that, a pattern for obtaining a separated reflective layer for each sub pixel was exposed on the resist, developed, and post-baked to form a patterned resist. The reflective layer 102 was divided for respective sub pixels by etching processing, and then the resist was removed.

Again, a positive type resist was formed on the reflective layer 102 by spin coating and then pre-baked. A periodic structure pattern of the tetragonal lattice as illustrated in FIG. 2 was exposed on the resist, developed, and post-baked to form a patterned resist. Periodic structures were formed in the surface of the reflective layer 102 by etching processing. In Example 1, an R-periodic structure 501 had 345 nm in period, 200 nm in side length, and 40 nm in etching depth. A G-periodic structure 502 had 250 nm in period, 140 nm in side length, and 40 nm in etching depth. A B-periodic structure 503 had 200 nm in period, 140 nm in side length, and 40 nm in etching depth. Then, the resist was removed.

In the tetragonal lattice as illustrated in FIG. 2, the periods (arrangements) of the periodic structures 501, 502, and 503 in respective sub pixels in the vertical direction and the horizontal direction are equal to each other. Therefore, when the light emitting apparatus is visually recognized, the same optical characteristics can be obtained in the vertical direction and the horizontal direction, thereby improving visibility. Conversely, a square lattice whose periods in the vertical direction and the horizontal direction are different from each other may be used. In this case, the visibility can be adjusted according to the direction. When different tetragonal lattices are combined, the same optical characteristics can be obtained in the vertical direction, the horizontal direction, and the oblique direction, thereby improving the visibility.

Next, a film made of IZO which is a transparent conductive material was formed as the first electrode 103 at a thickness of 100 nm by sputtering. A refractive index of the IZO film was 2.0. A positive type resist was first formed on the IZO film by spin coating and then pre-baked. As illustrated in FIG. 2, a pattern for obtaining a shape corresponding to the emission region 201 was exposed on the resist, developed, and post-baked to form a patterned resist. The reflective layer 102 was formed in the emission region 201 by etching processing. Then, the resist was removed.

Next, a negative photosensitive acrylic-based resin with liquid repellency was formed as the optical waveguide 100 on the reflective layer 102 so as to surround the first electrode 103. A refractive index of the negative photosensitive acrylic-based resin was 1.5. In this example, as illustrated in FIG. 5B, the liquid repellent material was formed between adjacent light emitting devices. A region serving as the optical waveguide 100 is a region sandwiched between the reflective layer 102 and the second electrode 106. In order to make an optical distance 504 of the optical waveguide 100 equal to an optical distance of a functional layer described later, the optical waveguide 100 was formed such that a thickness of the region serving as the optical waveguide 100 became 290 nm. Firstly, the negative photosensitive acrylic-based resin with liquid repellency was spin-coated and then pre-baked. After that, a pattern for forming the emission region as an aperture portion as illustrated in FIG. 5B was exposed on the negative photosensitive acrylic-based resin with liquid repellency, developed, and post-baked to form the optical waveguide 100.

Next, respective functional layers for R, G, and B were formed by application using a dispenser apparatus for successively discharging liquid columns from a nozzle.

While necessary amounts of materials are successively dropped from the nozzle, the nozzle was transported over the emission region 201 in a Y-direction (for example, along dotted line 510) at high speed. When a solution viscosity and a pressure were adjusted, a necessary amount of material can be dropped on the emission region 201 by one-time discharge.

Firstly, a film made of PEDOT-PSS (Al-4083, produced by H. C. Starck Ltd.) was formed as a hole injection layer at a thickness of 40 nm in each sub pixel between liquid repellent waveguides using a dispenser apparatus. A refractive index of the film was approximately 1.55.

Next, respective R-, G-, and B-emission layers were formed on the hole injection layer. The R-emission layer was formed at a thickness of approximately 100 nm using an R-emission layer application liquid containing red phosphorescent emission iridium metal complex as a guest material and polyfluorene as a host material. A refractive index of the R-emission layer was approximately 1.73. The G-emission layer was formed at a thickness of approximately 100 nm using a G-emission layer application liquid containing fluoranthene-based condensation polycyclic compound as a guest material and polyfluorene as a host material. A refractive index of the G-emission layer was approximately 1.70. The B-emission layer was formed at a thickness of approximately 80 nm using a B-emission layer application liquid containing pyrene-based condensation polycyclic compound as a guest material and oligofluorene as a host material. A refractive index of the B-emission layer was approximately 1.70. In this example, a state in which the applied respective R-, G-, and B-emission layers were separated for respective sub pixels by the optical waveguide 100 with the liquid repellency was observed.

A common electron transport layer was formed on the respective R-, G-, and B-emission layers at a thickness of approximately 20 nm by vacuum vapor deposition method using bathophenanthroline (Bphen). A refractive index of the common electron transport layer was approximately 1.73.

Then, a common electron injection layer was formed at a thickness of 10 nm by co-evaporation using Bphen and $Cs_2CO_3$ (weight ratio 90:10). A refractive index of the common electron injection layer was approximately 1.75.

After the formation of the electron injection layer, the resultant substrate was transferred to a sputtering apparatus without breaking vacuum, and an Ag alloy film whose thickness was 24 nm was formed as the metal translucent film which was the second electrode 106 by sputtering.

In this example, the optical distance $\Sigma(nEi \cdot dEi)$ of the emission region 201 in the direction perpendicular to the substrate surface was a total thickness from the IZO film corresponding to the first electrode 103 to the electron injection layer, which was approximately 450 nm to 490 nm in each of R-, G-, and B-sub pixels.

The optical distance $\Sigma(nWi \cdot dWi)$ of the optical waveguide 100 in the direction perpendicular to the substrate surface was the distance 504 between the reflective layer 102 and the second electrode 106, which was approximately 480 nm. This distance is smaller than twice the optical distance of the emission region 201.

Then, a silica film (not shown) whose thickness was 290 nm was formed as a dielectric layer by sputtering. A desiccant was provided in a peripheral portion of the light emitting apparatus. The light emitting apparatus was sealed with an etched cap glass (not shown). Therefore, the organic EL light emitting apparatus was obtained.

In this example, the upper surface of the bank was provided with the liquid repellency, and hence the application liquid was repelled on the upper surface of the bank and did not enter an adjacent pixel. Therefore, pixel separation was easily achieved. A light emission intensity of the light emitting device obtained as described above was evaluated. As a result, a light emission intensity which is approximately 1.8 times in a case of a light emitting device without the periodic structure was obtained in each of the R-, G-, and B-sub pixels (see Comparative Example 1). As described above, according to the present invention, the light extraction efficiency can be improved without adversely affecting the functional layer of the light emitting device.

EXAMPLE 2

Figure 6A:
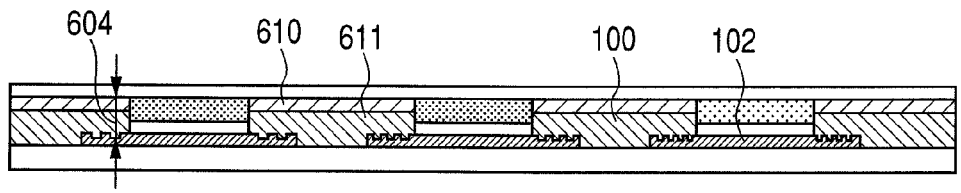
FIGS. 6A and 6B are schematic views illustrating a light emitting apparatus according to Example 2.
Figure 6B:
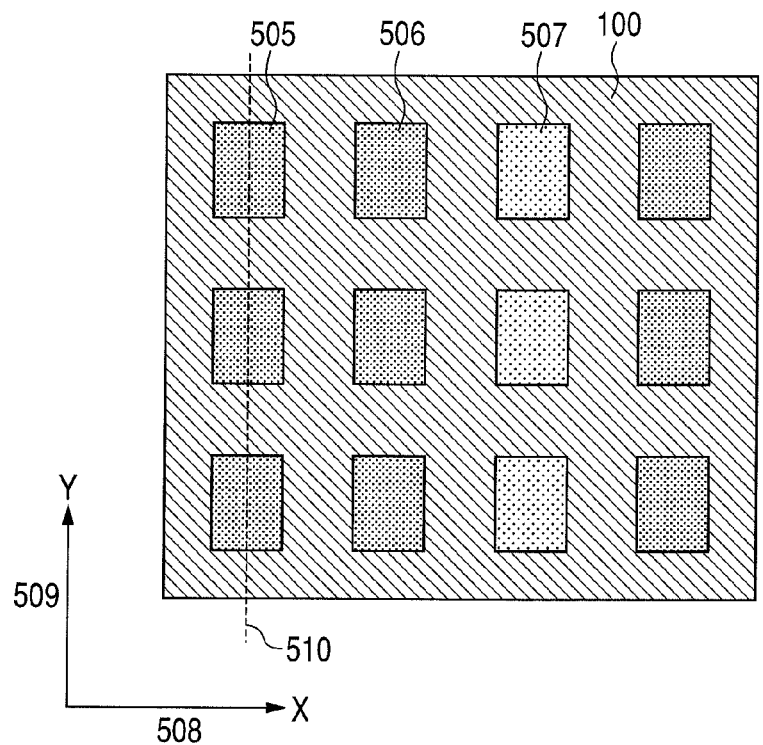

FIGS. 6A and 6B are schematic views illustrating a light emitting apparatus according to Example 2.

In Example 2, a case where a liquid repellent resin 610 was formed as the optical waveguide 100 on a transparent inorganic insulating film 611 made of SiN as illustrated in FIGS. 6A and 6B is described.

In Example 2, the light emitting device was produced as in Example 1 except for the optical waveguide 100. The same process as in Example 1 was performed until the first electrode was formed.

Next, the optical waveguide 100 was formed. Firstly, the SiN film was formed at a thickness of approximately 170 nm by sputtering. A refractive index of the SiN film was 2.1. After that, a positive type resist was formed by spin coating and then pre-baked. A pattern for forming the emission region as an aperture portion was exposed on the resist, developed, and post-baked to form a patterned resist. Then, as illustrated in FIG. 6B, the SiN film was patterned by etching processing to form the emission region into an aperture shape.

Next, a negative photosensitive acrylic-based resin with liquid repellency was formed in a region of the reflective layer 102 at a thickness of 50 nm by spin coating and then pre-baked. A refractive index of the negative photosensitive acrylic-based resin was 1.5. After that, as illustrated in FIG.

6B, a pattern for forming the emission region as an aperture portion was exposed on the negative photosensitive acrylic-based resin with liquid repellency, developed, and post-baked to form the optical waveguide 100.

In this example, an optical distance 604 of the optical waveguide 100 in the direction perpendicular to the substrate surface was approximately 480 nm and became smaller than twice the optical distance of the emission region.

The functional layer was formed by the same process as in Example 1. Then, the same process was performed until the sealing with the cap glass was completed.

In this example, the upper surface of the bank was provided with the liquid repellency, and hence the application liquid was repelled on the upper surface of the bank and did not enter an adjacent pixel. Therefore, pixel separation was easily achieved.

A light emission intensity of the light emitting device obtained as described above was evaluated. As a result, a light emission intensity which was approximately 1.8 times in a case of a light emitting device without the periodic structure was obtained in each of the R-, G-, and B-sub pixels (see Comparative Example 1).

COMPARATIVE EXAMPLE 1

Figure 7:
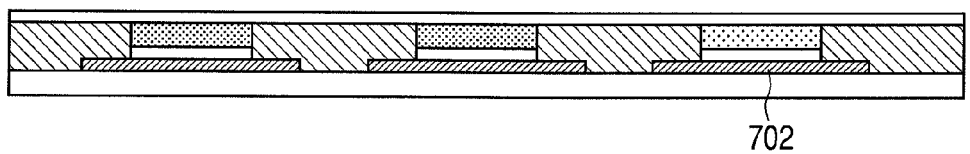
FIG. 7 is a schematic view illustrating a light emitting apparatus according to Comparative Example 1.

FIG. 7 is a schematic view illustrating a light emitting apparatus according to Comparative Example 1.

In Comparative Example 1, a case where no periodic structure is provided is described as illustrated in FIG. 7.

In Comparative Example 1, the light emitting device was produced as in Example 1 except for a point that no periodic structure was formed on the reflective layer.

In Comparative Example 1, an Ag alloy film was formed as a reflective layer 702 at a thickness of approximately 150 nm by sputtering and patterned to divide the reflective layer for respective sub pixels. After that, no periodic structure pattern was formed in the reflective layer 702. That is, in Comparative Example 1, no periodic structure was provided.

Then, the same process as in Example 1 was performed until the sealing with the cap glass was completed.

A light emission intensity of the light emitting device obtained as described above was evaluated. As a result, a light emission intensity which was smaller than in the case of the light emitting apparatus according to Example 1 was obtained in each of the R-, G-, and B-sub pixels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-122892, filed May 9, 2008, which is hereby incorporated by reference herein in its entirety.

The invention claimed is:

1. A light emitting apparatus comprising:
a substrate;
multiple light emitting devices formed on the substrate, each of the multiple light emitting devices comprising:
a reflective layer;
a first electrode;
a functional layer including an emission layer with an emission region; and
a second electrode; and
an optical waveguide which is formed between the emission regions and comprises a periodic structure,
wherein the optical waveguide has an optical distance in a direction perpendicular to a surface of the substrate, which is smaller than twice an optical distance of each of the emission regions in the direction perpendicular to the surface of the substrate, and
wherein the optical distance of the optical waveguide in the direction perpendicular to the surface of the substrate is 3/8 times or more to 11/8 times or less a light emission peak wavelength $\lambda$ of the emission layer.

2. The light emitting apparatus according to claim 1, wherein the optical waveguide comprises a surface which is opposite to the substrate and is more repellent to a light emitting material liquid for forming the emission layer than the emission region.

3. The light emitting apparatus according to claim 1, wherein the optical waveguide has an insulating property.

4. The light emitting apparatus according to claim 1, wherein the second electrode is further formed on the optical waveguide and comprises one of a light transmissive electrode and a metal translucent electrode.

5. The light emitting apparatus according to claim 1, wherein the periodic structure contains metal.

* * * * *